United States Patent [19]

Karpinski

[11] Patent Number: 5,040,187
[45] Date of Patent: Aug. 13, 1991

[54] MONOLITHIC LASER DIODE ARRAY

[76] Inventor: Arthur A. Karpinski, Barker Rd., Jordan, N.Y. 13080

[21] Appl. No.: 460,459

[22] Filed: Jan. 3, 1990

[51] Int. Cl.$^5$ ............................................... H01S 3/19
[52] U.S. Cl. ...................................... 372/50; 372/34; 372/37; 357/17; 357/55; 357/80
[58] Field of Search ....................... 372/50, 34, 35, 36; 357/55, 17, 80

[56] References Cited

U.S. PATENT DOCUMENTS 4,881,237 11/1989 Donnelly .............................. 372/50

FOREIGN PATENT DOCUMENTS 0014181 2/1979 Japan ..................................... 372/36

Primary Examiner—Georgia Epps
Attorney, Agent, or Firm—Sughrue, Mion, Zinn, Macpeak & Seas

[57] ABSTRACT

Laser diode array fabrication is facilitated by provision of a monolithic substrate with one or more grooves of the same approximate depth and width as laser diodes secured therein. A metallization layer is provided in the grooves, and the laser diodes secured in the grooves thereafter. Depending on the size of the original substrate being used for the laser array mount, one or more submounts may be formed by cutting the substrate. Additionally, insertion of the laser diodes into the grooves may be facilitated by flexure of the substrate from the bottom, thus separating the groove walls at the top.

16 Claims, 4 Drawing Sheets

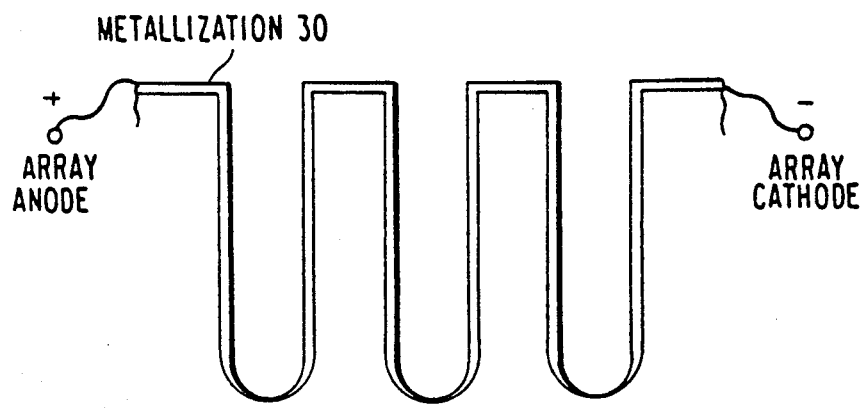
FIG. 3
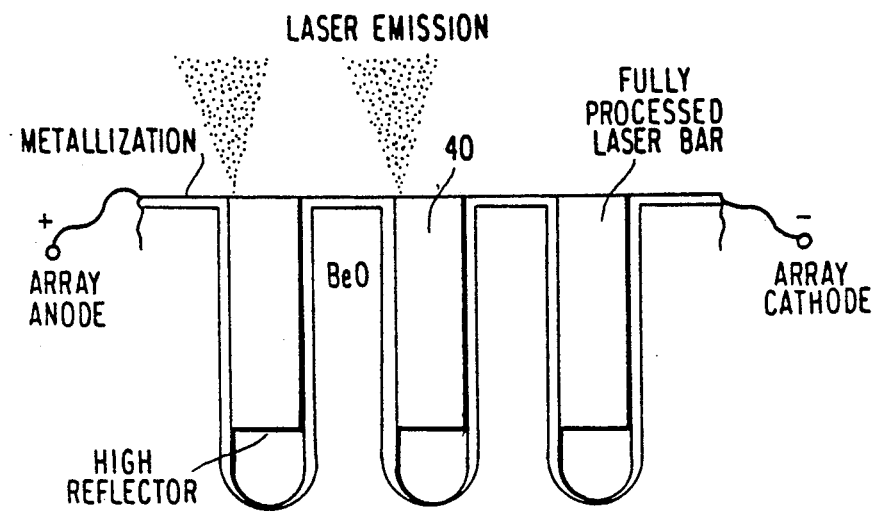
FIG. 4
FIG. 5
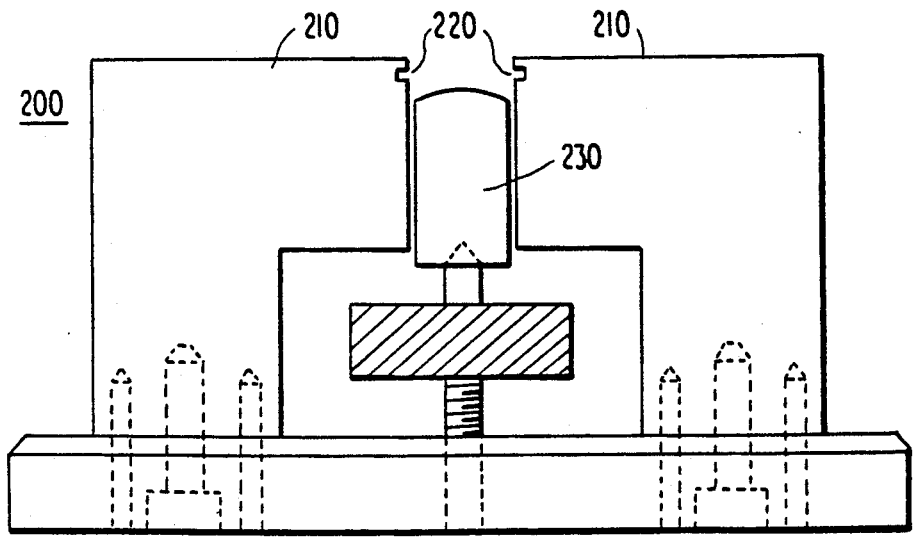

MONOLITHIC LASER DIODE ARRAY

BACKGROUND OF THE INVENTION

The present invention relates to a one-dimensional or two-dimensional laser diode array, and particularly to a structure for mounting one or a plurality of laser diodes on a monolithic substrate as a subassembly of a working laser device, and to a method of fabrication of such a subassembly. The invention has application in many areas in which high power semiconductor laser arrays are used, including satellite communications, directed energy applications, remote sensing of atmospheric conditions, range finding and isotope separation. Other applications include optical recording, computing, laser machining, level sensing, and remote sensing.

While there have been substantial improvements over the last few years in performance and reliability of laser diode materials, such as AlGaAs, there have not been corresponding improvements in the area of packaging technologies for laser diodes. To date, existing first generation laser packaging techniques have utilized either soft solder (In) or Sn/Au soldering systems on Cu, BeO, Thermkon (tm), or even diamond substrates. Although these techniques are adequate for fabricating engineering prototypes, they are not suitable for high volume fabrication of reliable, low cost, one-dimensional (1D) and two-dimensional (2D) laser arrays.

One example of a laser packaging technique known to the inventor of the present application, the inventor having participated in the development of that technique is known as the "Rack & Stack" assembly process. According to this process, individual 1D subarrays are assembled, and are mounted on a backplane to form a 2D array. The number of parts involved makes it very difficult to achieve high volume production, particularly since the number of assembly steps is large and yield has tended to be relatively low. Many of the individual assembly steps require careful alignment of the individual subarrays contributing to longer required assembly time and lower yield. Further, the 1D subarrays used are not reworkable; if a flaw is discovered in a part of the subarray, the entire subarray must be scrapped, as individual laser diodes in the subarray cannot be replaced.

SUMMARY OF THE INVENTION

In view of the foregoing, it is an object of the invention to provide a less expensive, more efficient approach to manufacture of laser arrays through facilitation of mounting of laser diodes on a monolithic substrate.

It is another object of the invention to provide low-cost 1D and 2D laser arrays which can be manufactured in high volume with high reliability.

To achieve the foregoing and other objects, the inventive monolithic laser diode array includes a monolithic substrate having at least one groove formed therein; a metallization layer provided along the side walls of that groove; and at least one laser diode that fits into the groove. According to one preferred embodiment, the monolithic substrate may be flexible, bending so as to open up the metallized grooves sufficiently to allow insertion of the laser diode into the device, the diodes being secured through force provided by the walls of the metallized grooves. Alternatively, the metallized grooves may be slightly larger than the laser diode to be inserted therein, adhesive or other bonding material being used to secure the laser diode within the metallized groove. These two approaches also may be combined.

Also in accordance with the invention, there is provided a method of fabricating monolithic laser diode arrays, comprising the following steps: providing a monolithic substrate; forming one or more grooves in the substrate; depositing a metallization layer along side walls of the grooves; and disposing a plurality of laser diodes in the metallized grooves.

One effect of the inventive structure and technique that leads to higher yields is that laser diodes placed in grooves have sufficient mechanical and electrical contact with the metallization that they can be pre-tested prior to permanent attachment. As a result, faulty laser diodes can be identified before assembly is complete, obviating the need to scrap an entire assembly.

BRIEF DESCRIPTION OF THE DRAWINGS

The foregoing and other objects and features of the invention now will be described in detail with reference to the accompanying drawings, in which:

FIG. 3 is a partial side view of the substrate with a metallization layer formed therein;

FIG. 4 is a partial side view of the metallized substrate with laser diodes disposed therein to form a submount;

FIG. 5 is a side view of a assembly fixture for performing flexure on the substrates of FIGS. 1 and 2;

DESCRIPTION OF THE PREFERRED EMBODIMENTS

Figure 1:
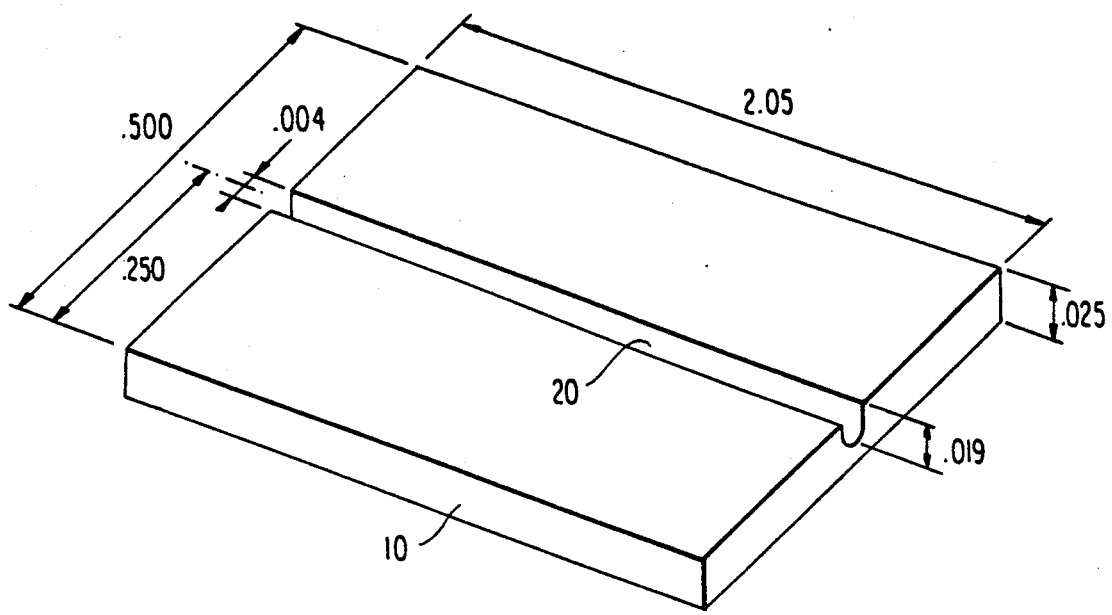
FIG. 1 is a drawing of a monolithic substrate with a single groove formed therein, for fabrication of a one-dimensional array.

Referring to FIG. 1, a monolithic substrate 10, which may be formed of BeO (which may be small grain BeO), AlN, or any highly thermally conductive material, preferably ceramic is, in this embodiment, approximately 0.500"×0.400"×0.025". Of course, other sizes may be provided, depending on the desired application. For example, a substrate that is 2.00"×2.00"×0.025" (generally an industry standard for ceramics) may be used. The thickness of the substrate also may vary; for example, a 40 mil thick substrate also is an industry standard. Depending on manufacturing considerations, the first formed substrate may be relatively large, and then may be cut into smaller arrays, or submounts, at an appropriate step in the fabrication process.

Figure 2:
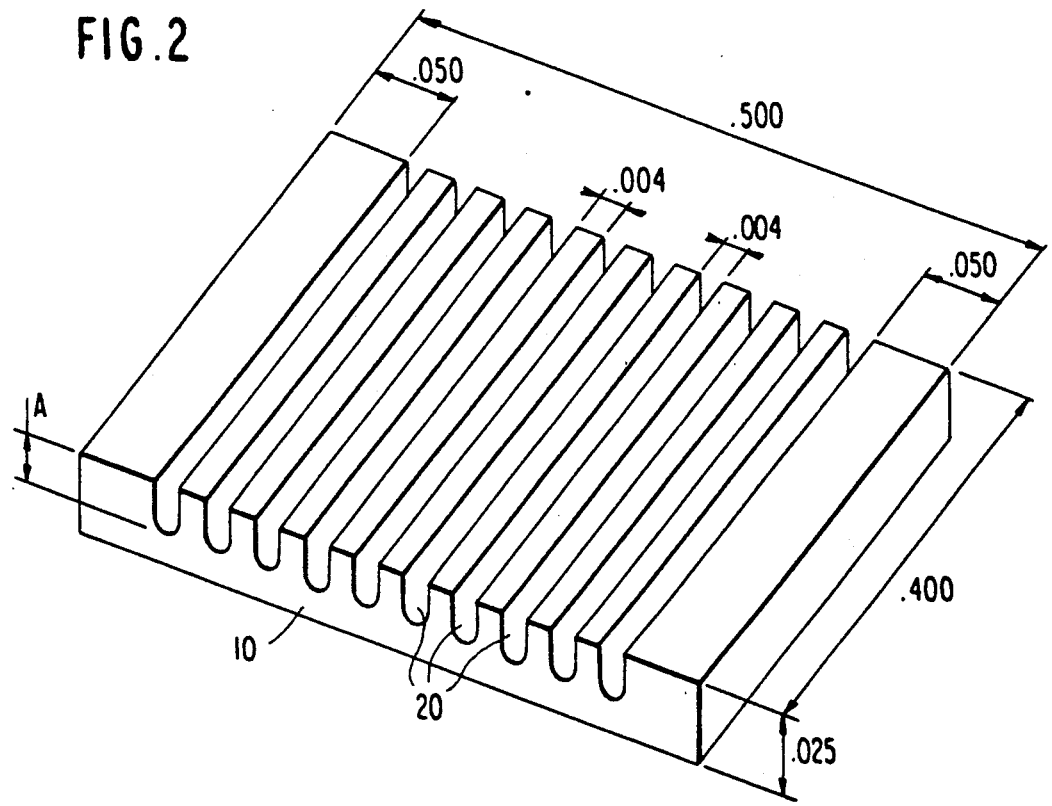
FIG. 2 is a drawing of the substrate with a plurality of grooves formed therein, for fabrication of a two-dimensional array.

The substrate 10 may be polished on both sides to a 3 to 4 μm finish, and the overall thickness is reduced to 25 mils. A groove 20 is formed approximately 0.018" deep and 0.004" wide, along the second of the above-mentioned dimensions. The groove 20 may be wider at the top than at the bottom, depending on manufacturing conditions. The groove 20 may be provided with a rounded bottom as shown. The grooves 20 shown in FIG. 2 preferably have substantially the same dimensions. In FIG. 2, a 0.004" separation between adjacent grooves is provided and a 0.050" margin is provided on either side. Thus, for a substrate 0.500" wide, 50 grooves may be cut. However, it should be understood that the design is not limited to these dimensions. The grooves may be farther apart or closer together, as required by the end user of the array.

Referring to FIG. 3, metallization layer 30 is provided, using one or more of Cr, Ti, Ni, Au, or Ag, or alloys thereof, or any suitably conductive material that adheres sufficiently to the substrate, with a standard metal evaporator or any other suitable plating technique, such as that used in the fabrication of printed circuit boards. Generally, the practice is to use various combinations of the above-mentioned materials. For example, Cr or Ti may be used first, because they bond well to the substrate material (which usually is ceramic). Then, a thick layer of Ni may be applied, to handle the current that will flow through the metallization layer. Then, a layer of Au may be provided, because it may be used to form thermocompression bonds.

Metallization of the substrate decreases the size of the grooves. According to one preferred embodiment, the metallized grooves may be perhaps a few tenths of a mil smaller than the overall thickness of the laser diodes to be inserted therein. According to another preferred embodiment, the grooves may be slightly larger than the laser diodes.

Metallization may be removed from the bottom of each groove by shadowing or masking, which are well-known industry standard metallization techniques in order to provide electrical isolation.

Once the metallization step has been performed, the metallized substrates are sized and isolated to form arrays of a suitable size. For example, a 2.00 "×2.00" array may be cut into individual 1 cm² arrays.

Once this step is accomplished, laser diodes 40 then may be loaded into each array, as shown in FIG. 4. This may be done in one of at least two presently preferred ways, depending on whether the metallized grooves are narrower than the diodes to be inserted therein. If the metallized grooves are narrower, then the array is loaded into a device capable of performing controlled bending, or flexure, of the substrate 10, by providing a force from the bottom of the substrate toward the top. This flexure enables temporary enlargement, or widening of each groove, to facilitate insertion of the laser diodes 40.

One example of a fixture assembly which can perform the necessary controlled bending is shown in FIG. 5. The assembly 200 includes two L-shaped pieces 210 with respective grooves 220 formed therein, into which the substrate 10 fits. The pieces 210 are retractable away from each other to permit insertion of the substrate, whereupon the pieces may be urged toward each other to hold the substrate. A flexure member 230 having a curved upper surface is provided between the L-shaped members. To achieve flexure of the substrate, the flexure member 230 is urged upwardly toward a bottom of the substrate 10. It should be noted that uniformity of depth of the grooves 20 is important to the achievement of proper flexure; nonuniform grooves can lead to fracture of the substrate at the point of the shallowest groove.

After insertion, the bending of the substrate is terminated, establishing good mechanical and electrical contact between the laser diodes 40 and their respective metallized grooves. The electrical contact is sufficient at least to allow pre-testing of the diodes at low power, so that faulty diodes can be replaced before effecting permanent attachment (if such is either necessary or desired), as for example by thermocompression bonding.

One aspect of the "bending" approach is that it may be possible to rely on compressive forces of the substrate material to secure the laser diodes permanently in the substrate, without having to resort to additional process steps. Such an approach can reduce the number of parts required for assembly. Nevertheless, whether the metallized grooves are wider or narrower than the laser diodes, adhesion of the diodes in the grooves may be effected as follows. The pretested laser array may be placed in a vacuum oven, and (assuming gold is used for the metallization layer), the array is heated to allow the gold metallization to enter the plastic stage, thus removing stresses induced during prior assembly stages, and forming a gold thermocompression bond between the laser diode 40 and the substrate 10. Other attachment approaches also are possible, and would include standard reflow, or the use of adhesives, such as a conductive Ag, Au, Cu, or Al filled epoxy, or any epoxy containing particulate which will provide thermal and electrical continuity.

The laser diodes 40 may be facet coated with a multilayer high reflectance dielectric stack if it is desired to achieve single ended emission, so that light is emitted only from the top of the array.

FIG. 4 shows laser diodes placed in a submount. For purposes of pre-testing, for example, such submounts can be easier to work with than a larger mount. Also, insertion of laser diodes into a smaller structure is easier. Further, using smaller submounts, in a modular approach, makes it easier to form arrays of different configurations. Also, customers often request such small submounts.

Any commercially manufactured laser diode may be used in the inventive array. One such laser diode is manufactured by NorthEast Semiconductor, Inc. (NSI) as quantum well heterostructure laser diode bars, formed using molecular beam epitaxy (MBE) techniques. This approach has been found to be preferable to organometallic vapor phase epitaxy with respect to both uniformity over a 3" diameter deposition area, and with respect to toxic sources used. Uniformity is particularly important in reducing fabrication costs, to avoid the need for wavelength sorting of processed laser bars which generally must fall within a narrow spectral window.

Using MBE growth of a graded index separate confining heterostructure single quantum well (GRINSH-SQW) laser structure, NSI has achieved less than 1 nm variation in emission wavelength over a 2" GaAs substrate, and less than 3 nm run to run variation.

Figure 6A:
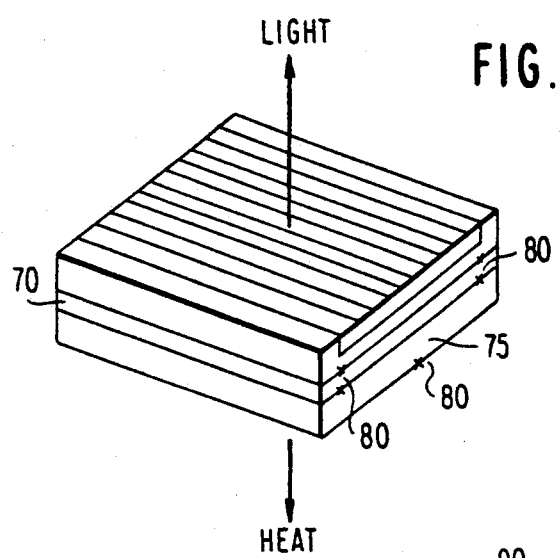
FIGS. 6A and 6B show the submount with other laser device components forming a subassembly.

FIG. 6A shows a 2D array module with a eutectic bond 70, which may be gold, and a BeO heat spreader (which is optional) and electrical interconnect 75 with electrical isolation points 80. Heat flows from the array, through the heat spreader; light goes in the opposite direction. Instead of a heat spreader, a thicker substrate 10 may be used, in which case the thicker bottom portion of the substrate would spread heat.

Figure 6B:
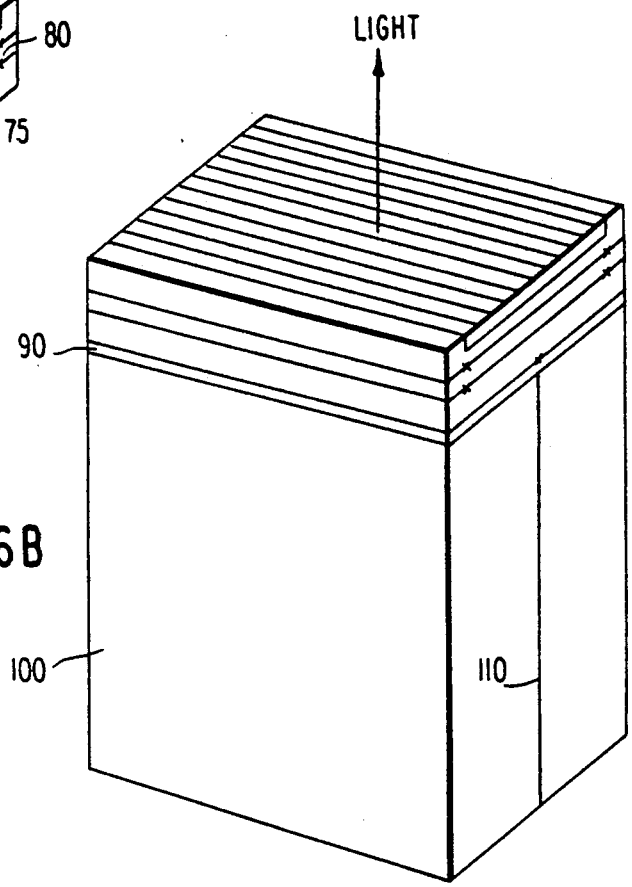

FIG. 6B shows the FIG. 6A structure, bonded via a solder bond 90 to a water-cooled copper heat sink 100. A polymide, fiberglass, or other suitable insulator 110 also is provided.

Figure 7:
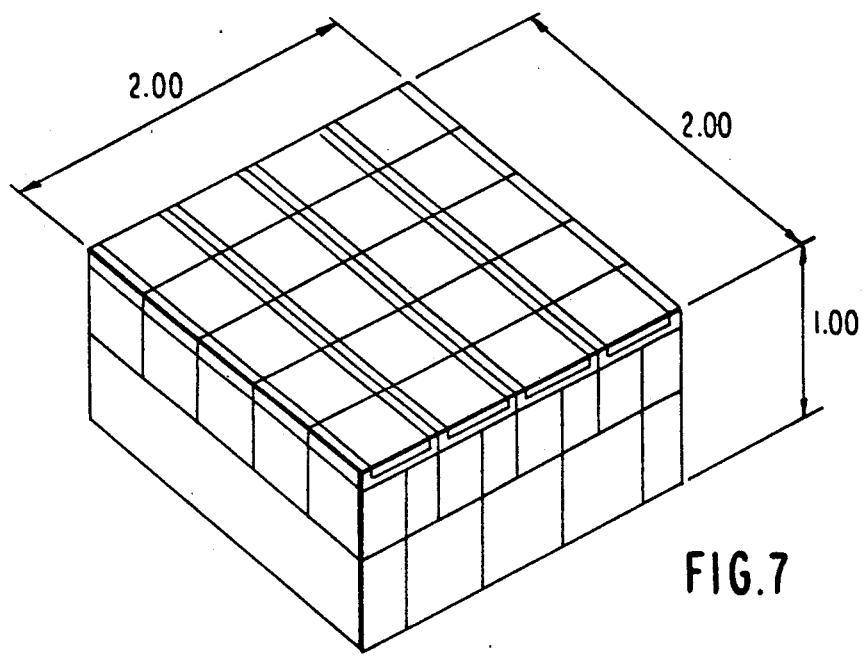
FIG. 7 is a drawing showing a plurality of subassemblies forming an overall laser module assembly.

FIG. 7 shows a plurality of the arrays of FIG. 5, formed into a larger overall array that measures 2.00"×2.00"×1.00". As shown, there are 20 laser modules, with 5000 diodes per module (100,000 diodes overall). At a 2.5% duty cycle, there is 100kW peak power dissipation. As wired, the power requirements are 500A ×400V, for 200kW input peak. For heat dissipation, 40 gallons per hour flow rate is provided through the water-cooled copper heat sink.

Figure 8:
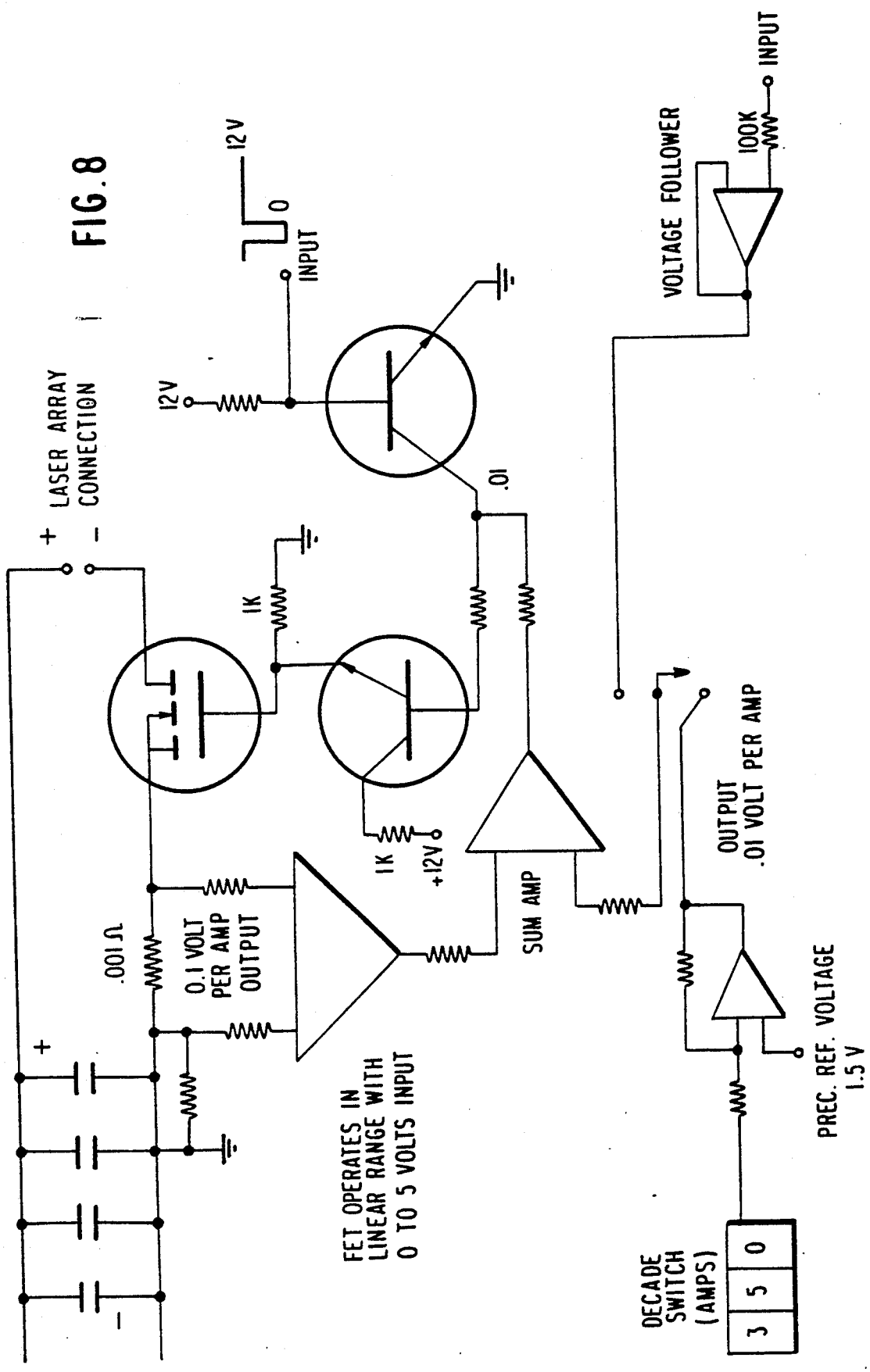
FIG. 8 is a diagram of driving circuitry for the laser array.

FIG. 8 shows one implementation of driving circuitry for the FIG. 7 array. Any other appropriate driving circuitry may be used, so long as the abovementioned power requirements are met.

Experiments have been carried out with respect to the foregoing implementation. Testing has been performed with a prototype 2D laser array operating at 776nm, achieving 40% conversion efficiency at a power density of 2.5 kW/cm$^2$.

While one embodiment of the invention has been described above in detail, various changes and modifications within the scope and spirit of the invention will be apparent to those of working skill in this technological field. For example, metallization and/or isolation within the substrate may be accomplished through patterning and/or mechanical isolation (i.e. cutting into the substrate). Thus, the invention is to be considered as limited only by the scope of the appended claims.

What is claimed:

1. A monolithic laser diode array comprising:
   a monolithic substrate having upper and lower major surfaces and at least one groove formed in said upper major surface along a length of said substrate, said at least one groove having side walls formed vertically in said substrate;
   a metallization layer disposed along said side walls of said at least one groove to form at least one metallized groove; and
   a plurality of laser diodes disposed in said at least one metallized groove.

2. An array as claimed in claim 1, wherein a plurality of grooves are formed in said upper major surface such that said metallization layer forms a plurality of metallized grooves, and said plurality of laser diodes are disposed in each of said metallized grooves, forming a two-dimensional array.

3. An array as claimed in claim 1, wherein said substrate is formed of such a material and has such a thickness, and said groove is formed to such a depth as to permit flexure of said substrate through provision of force in a direction from a bottom of said substrate.

4. An array as claimed in claim 1, wherein said substrate comprises a material selected from the group consisting of BeO and AlN.

5. An array as claimed in claim 1, wherein said metallization layer comprises a metal selected from the group consisting of Au, Ag, Ti, Ni, and Cr.

6. An array as claimed in claim 1, further comprising a soldering layer for attaching said plurality of laser diodes within said metallized groove, said soldering layer comprising a solder selected from the group consisting of Au/Si, Au/Sn, In, and Pb.

7. An array as claimed in claim 1, further comprising:
   a heat spreader mounted on said lower major surface of said substrate;
   a heat sink attached to an opposite side of said heat spreader from said substrate; and
   driving circuitry, connected to said substrate, for driving said laser diodes.

8. An array as claimed in claim 7, wherein said heat spreader is attached to said lower major surface of said substrate via a eutectic bond.

9. A monolithic laser diode array comprising:
   a monolithic substrate having upper and lower major surfaces and at least one groove formed in said upper major surface along a length of said substrate, wherein said substrate is formed of such a material and has such a thickness, and said at least one groove is formed to such a depth as to permit flexure of said substrate through provision of force in a direction from a bottom of said substrate;
   a metallization layer disposed along side walls of said at least one groove to form at least one metallized groove; and
   a plurality of laser diodes disposed in said at least one metallized groove.

10. An array as claimed in claim 9, wherein a plurality of grooves are formed in said upper major surface, such that said metallization layer forms a plurality of metallized grooves, and said plurality of laser diodes are disposed in each of said metallized grooves, forming a two-dimensional array.

11. An array as claimed in claim 9, wherein said substrate comprises a material selected from the group consisting of BeO and AlN.

12. An array as claimed in claim 9, wherein said metallization layer comprises a metal selected from the group consisting of Au, Ni, and Cr.

13. An array as claimed in claim 9, further comprising a soldering layer for attaching said plurality of laser diodes within said metallized groove, said soldering layer comprising a solder selected from the group consisting of Au/Si, Au/Sn, In, and Pb.

14. An array as claimed in claim 9, further comprising:
   a heat spreader mounted on said lower major surface of said substrate;
   a heat sink attached to an opposite side of said heat spreader from said substrate; and
   driving circuitry, connected to said substrate, for driving said laser diodes.

15. An array as claimed in claim 14, wherein said heat spreader is attached to said lower surface of said substrate via a eutectic bond.

16. A monolithic laser diode array comprising:
   a monolithic substrate having upper and lower major surfaces and at least one groove formed in said upper major surface along a length of said substrate;
   a metallization layer disposed along side walls of said at least one groove to form at least one metallized groove; and
   a plurality of laser diodes disposed in said at least one metallized groove, such that a radiation emitting surface of each of said laser diodes is parallel to said upper major surface of said substrate.

* * * * *